United States Patent [19]

Anjo

[11] Patent Number: 4,974,054
[45] Date of Patent: Nov. 27, 1990

[54] RESIN MOLDED SEMICONDUCTOR DEVICE

[75] Inventor: Ichiro Anjo, Koganei, Japan

[73] Assignee: Hitachi, Ltd., Tokyo, Japan

[21] Appl. No.: 313,438

[22] Filed: Feb. 22, 1989

[30] Foreign Application Priority Data

Feb. 24, 1988 [JP] Japan ................................. 63-39376

[51] Int. Cl.$^5$ ..................... H01L 23/48; H01L 29/46; H01L 29/54; H01L 29/62
[52] U.S. Cl. ........................................ 357/71; 357/72; 357/65; 357/67; 437/180; 174/526
[58] Field of Search .................. 357/71, 71 R, 65, 72, 357/67; 174/52.6; 437/180

[56] References Cited

U.S. PATENT DOCUMENTS 3,125,803 3/1964 Rich ................................ 437/180 X

*Primary Examiner*—Rolf Hille
*Assistant Examiner*—Roy Potter

*Attorney, Agent, or Firm*—Antonelli, Terry, Stout & Kraus

[57] ABSTRACT

The trend toward higher integration degrees has caused the semiconductor pellets to have large sizes. In the resin molded semiconductor devices, in particular, cracks develop on the pellet due to contraction upon cooling that stems from the difference of coefficient of thermal expansion between the molding resin and the pellet. Cracks develop conspicuously under the ball of the wire that is bonded onto the bonding pad on the pellet. The area that receives the shearing stress increases with the increase in the ball portion, and the cracks develop easily.

To decrease the shearing stress and to prevent the crack from developing according to the present invention, the breaking strength of the bonding portion is set to be greater than the bending moment that is received depending upon the shape of the ball. That is, the ratio d/l of the thickness d of the ball portion and the width l of the alloy layer formed by the pad and the wire at the time of bonding is selected to be smaller than 0.2.

11 Claims, 5 Drawing Sheets

RESIN MOLDED SEMICONDUCTOR DEVICE

BACKGROUND OF THE INVENTION

The present invention relates to a resin molded semiconductor device, and particularly to improvements in the technology for bonding a wire for connection to a semiconductor pellet to which the wire is to be bonded.

In order for a semiconductor pellet to operate, inputs and outputs of electric signals must be taken out to the external units. For this purpose, aluminum electrodes (pads) on the pellet is connected (wire-bonded) to a lead frame on which the pellet is mounted using a connection wire such as gold wire.

Methods of wire bonding include thermocompression bonding, ultrasonic bonding, and a combination thereof. According to the thermocompression bonding method, in general, a ball (gold ball) on the tip of a connection wire (gold wire), formed by cutting the wire with a hydrogen torch, is attached onto a pad on a pellet with the application of heat and pressure. Specifically, in nailhead bonding the gold ball is held by the capillary and is bonded in a shape like a nailhead. According to the ultrasonic bonding method, the bonding is effected by applying a suitable pressure and ultrasonic vibration.

In such wire bonding methods, the bonding strength of the connection consisting of an alloy layer derived from an aluminum pad and a gold wire, for example, has been supposed to vary in proportion to the thickness of the tall-like portion at the tip of the bonding wire bonded to the pad on the pellet. Accordingly, user's demands have been for thick bonds.

In case of thin bonds, ultrasonic energy acts excessively on the pad and may cause damage. Therefore, thick bonds have generally been employed.

The technology of wire bonding has been described, for example, in Japanese Patent Laid-Open No. 5536/1986.

SUMMARY OF THE INVENTION

The present inventors have found problems as described below that are inherent in the abovementioned technology.

That is, in a resin molded semiconductor device which is molded with a resin to protect the pellet and the connection wires from the external environment, the molding resin usually cures at 150° to 200°C. and exhibits a coefficient of linear expansion of 1 to $2.5 \times 10^{-5}/°C$. which is greater than the coefficient of linear expansion of $3 \times 10^{-6}/°C$. that is exhibited by the pellet composed of silicon or the like. Therefore, shearing stress due to the contraction of the cured resin acts upon the wire bonding portion. In recent years, the pellets have become larger with the increase in the size of VLSI's. Large-capacity memories such as 1M DRAM (dynamic random access memory) and 1M pseudo SRAM (static random access memory) have rectangular chips measuring about 15 mm×5 mm, and accordingly larger stresses exert on the corners (peripheries) of the chips when the molding resin is cured and contracted. Furthermore, since the bonding pads are concentrated at the four corners of the chip, the bonded portions receive maximum stresses, and there develop cracks and input leakage due to cracks. The cracks may destroy the pellet.

According to the prior art, attention had not been given to the fact that the shearing force produced on the pellet due to the contraction of the molding resin gives rise to the development of excess stress at a portion where the wire is bonded to the bonding pad. In order to increase the strength of connection, furthermore, the bonding portion usually assumes the form of a large ball resulting, however, in the development of cracks when thermal stress such as temperature cycle is applied thereto.

In view of the above-mentioned circumstances, the present invention provides technology which prevents the lower portion of the bonding pad from being cracked even when thermal stress such as temperature cycle is applied thereto, and which helps improve the reliability without developing input leakage.

Furthermore, the object of the present invention is to eliminate the aforementioned defects which tend to develop as the size of the pellet increases.

Another object of the present invention is to provide favorable wire bonding technology.

A further object of the present invention is to increase the bonding strength.

Still further object of the present invention is to provide technology that contributes to enhancing the degree of integration of the semiconductor devices.

The above and other objects as well as novel features of the present invention wil become obvious from the description of the specification and the accompanying drawings.

A representative example of the invention described in this application will now be described briefly.

In the present invention, the thickness or the height above the pellet surface, of the bond where the wire is bonded to the bonding pad of the pellet is controlled to be as small as possible. In addition, the junction of the ball and the pad, composed of a gold-aluminum alloy layer, is allowed to have a larger area.

Furthermore, when the thickness is denoted by d and the width of the gold-aluminum alloy of the bonding portion where the aluminum pad and, for example, the gold wire are bonded together is denoted by l, the ratio d/l is selected to be smaller than 0.2.

That is, with the ratio d/l set to be smaller than 0.2, the breaking strength of the bond becomes greater than the bending moment that is received through the ball.

Owing to the actions mentioned below, the present invention makes it possible to obtain novel effects that are not found in the conventional art. That is, as shown in FIG. shearing force due to the contraction of the molding resin is applied to the ball-like bonding portion (hereinafter referred to as gold ball) where the connection wire is bonded to the bonding pad of the pellet, from the outside of the pellet toward the center thereof. The shearing force pushes the gold ball, whereby a moment is produced and a tensile stress generates at the end of the gold ball. Further, a crack develops when the tensile stress becomes greater than the breaking strength of the pellet.

Because of the above-mentioned mechanism, if the thickness of the gold ball is decreased, the area (sectional area) pushed by the gold ball decreases, whereby the stress decreases and no crack develops.

Similarly, if the junction area composed of the gold-aluminum alloy layer is widened, the concentrated stress acts less upon the end of the gold ball and crack is prevented from developing.

The study indicates that the generation of cracks can be prevented most effectively when the ratio d/l is smaller than 0.2, where d denotes the thickness of the gold ball and l denotes the width of the gold-aluminum alloy layer on the pad on the junction surface.

If mentioned in further detail, the distortion ($\tau$) at the corner of the pellet is a product ($\tau = (\alpha - \alpha') \times L$) of the length (L) of a diagonal line of the pellet and a difference between coefficients of thermal expansion ($\alpha$, $\alpha'$) of the resin and the pellet (Si). The moment received depending upon the shape is stress ($\sigma$) $\times$ ball thickness (d)/junction area (s), and the stress ($\sigma$) is distortion ($\tau$) $\times$ Young's modulus ($\epsilon$). Therefore, the breaking strength of the pellet at the bonding portion is greatly related to the distortion at the corner of the pellet. That is, cracks can be effectively prevented from developing in the pellet by suitably selecting the ratio of ball thickness (d)/junction width (l) as specified in the present invention.

DESCRIPTION OF THE PREFERRED EMBODIMENTS

Figure 1:
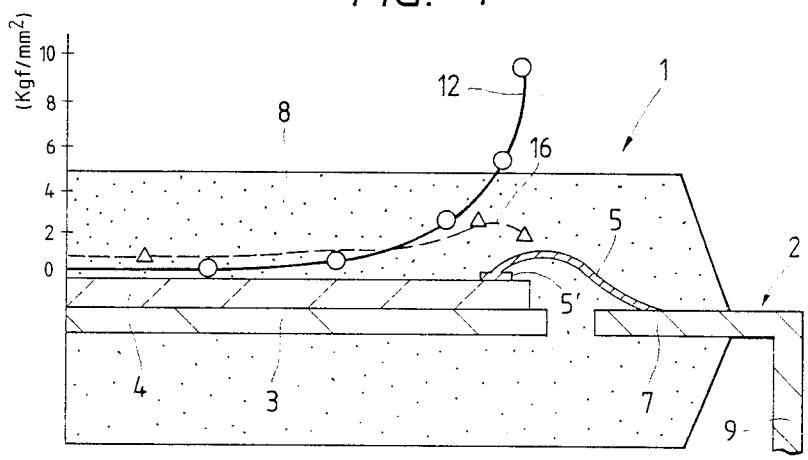
FIG. 1 is a section view illustrating a major portion of a resin molded semiconductor device according to an embodiment of the present invention, and shows changes in the shearing stress and in the vertical stress as a graph.

An embodiment of the present invention will now be described in conjunction with the drawings.

Hereinafter, those having the same functions are denoted by the same reference numerals, and their description is not repeated.

FIG. 1 is a plot showing changes in shearing stress 12 and vertical stress 16 along the distance from the center of the pellet 4 toward the outside (periphery).

In the resin molded semiconductor device 1 (hereinafter referred to as plastic package) of FIG. 1, a pellet 4 is die-bonded onto a tab 3 of a lead frame 2, an end of a connection wire 5 composed of, for example, gold is bonded onto a bonding pad 6 composed of a thin aluminum layer on the pellet 4 under the conditions of a temperature of about 200° C., a weight of 50 to 90 g and a time of 10 to 50 msec. to form a gold ball 5'. Further, the other end of the connection wire 5 is bonded to a tip of an inner lead 7 of the lead frame 2. Namely, the pellet 4 and the lead frame 2 are electrically connected together through the connection wire 5 that is bonded thereto, and the electric input and output signals are taken out to the external side so that the pellet 4 is allowed to work. The pellet 4 and the junction portion of the connection wire 5 and the pellet 4 are protected from the external environment being molded with a resin 8. The lead portion drawn from the resin molded portion 8 of the lead frame 2 is called outer lead 9. The outer lead 9 can be plugged into the mounting substrate such as a printed wiring board (not shown).

As shown in FIG. 1, the vertical stress 16 changes little irrespective of in the center of the pellet 4 or the periphery, whereas the shearing stress 12 gradually increases from the center of the pellet 4 toward the periphery thereof.

In other words, the shearing stress becomes the greatest near the bonding pad 6 where the connection wire 5 is bonded to give strong influence.

Figure 2:
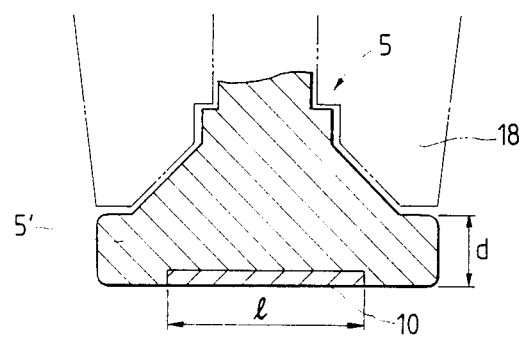
FIG. 2 is a section view illustrating a bonding portion where the connection wire is bonded.

According to the present invention, it was learned from these facts that as shown in FIG. 2, the thickness d of the bonding portion composed, for example, of a gold ball 5' to which the connection wire 5 is bonded be decreased as small as possible as measured from the pellet 4. That is, with the thickness d of the bonding portion (gold ball) 5' being decreased, the area (sectional area) of the bonding portion 5' that receives the shearing stress 12 decreases; i.e., the shearing stress 12 decreases and crack 14 does not develop easily. Reference numeral 18 denotes a capillary.

The shearing stress 12 that acts upon the bonding portion 5' will now be described with reference to FIG. 3.

Figure 3:
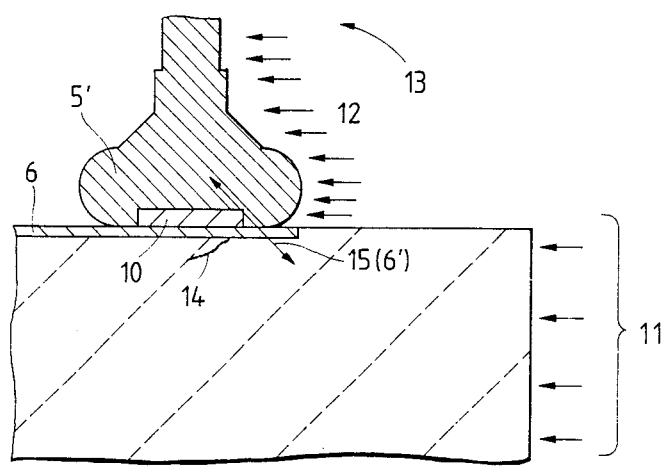
FIG. 3 is a section view which illustrates a mechanism of crack generation.

Referring to FIG. 3, contraction stress 11 acts on the pellet 4 as the molding resin cures and contracts, and shearing stress 12 acts on the gold ball 5' from the outside of the pellet toward the center thereof as the molding resin contracts. Further, since the shearing stress 12 pushes the gold ball 5', the gold ball 5' of the connection wire 5 receives a bending moment 13.

Crack 14 develops when the bending moment 13 becomes greater than the junction strength relative to the pellet 4.

In FIG. 3, reference numeral 15 denotes a direction in which a main maximum stress ($\sigma_1$) acts under the gold ball 5'. Further, when the connection wire 5 is composed of, for example, a gold wire and the bonding pad 6 of the pellet is, for example, an aluminum pad, the gold ball 5' of the connection wire is bonded to the aluminum pad 6 on the pellet 4 forming a gold-aluminum alloy 10. Symbol l denotes a width of junction.

On the other hand, the shearing stress 12 that acts on the gold ball 5' and the area of the junction portion 10 of the gold ball 5' establish an inversely varying relationship relative to each other. That is, the connection strength increases with the increase in the junction area. Even when the same shearing stress is exerted, therefore, the crack develops less since the connection strength is increased. Therefore, the shearing stress can be decreased. Namely, increasing the junction area as greatly as possible helps decrease the shearing stress 12.

Figure 4:
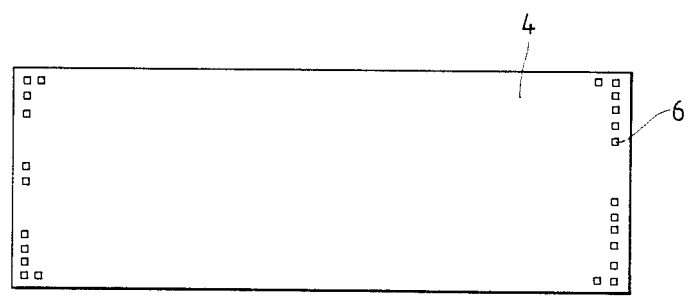
FIG. 4 is a plan view showing the arrangement of bonding pads on the pellet.

FIG. 4 is a plan view showing the arrangement of bonding pads 6 on the pellet 4. Shown here in a semiconductor pellet having a function of 1M DRAM. The pellet 4 has a long side of about 15 mm and a short side of about 5 mm exhibiting an elongated shape. It will be understood from FIG. 4 that the bonding pads 6 are concentrated in the periphery and particularly, at the corners of the pellet 4.

According to the study by the present inventors, it was learned that the stress concentrates at the ends of the gold-aluminum alloy portion 10, and the ratio d/l was set to be smaller than 0.2 as described earlier, where l is the junction width of the gold-aluminum alloy 10.

Figure 5:
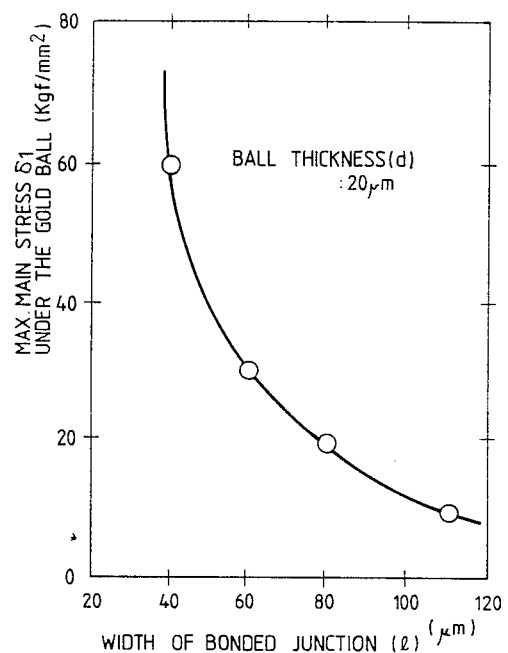
FIGS. 5 and 6 are graphs explaining the functions and effects of the present invention.
Figure 6:
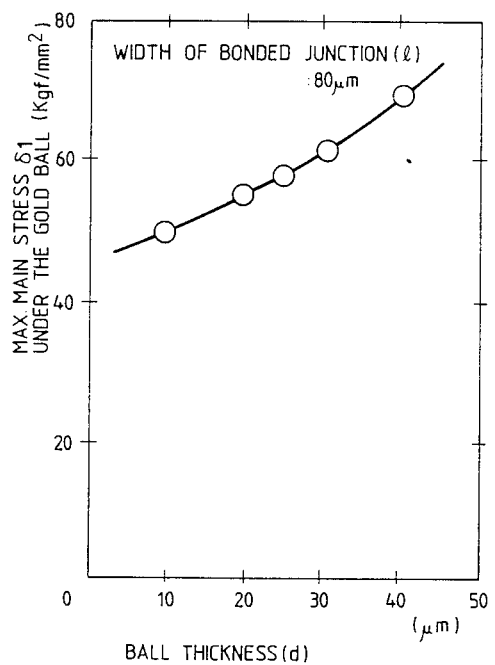

FIGS. 5 and 6 are graphs explaining the functions and effects of the present invention when the ratio d/l of the bonding thickness d to the junction width l is set to be smaller than 0.2.

In FIG. 5 is plotted a relationship between the width l of bonding junction and the maximum main stress $\sigma_1$ (kgf/mm$^2$) under the gold ball where the thickness d of the gold ball is constant. It is obvious from FIG. 5 that the maximum main stress $\sigma_1$ under the gold ball decreases with the increase in the width l of the bonding junction.

In FIG. 6 is plotted a relationship between the thickness d of the gold ball and the maximum main stress $\sigma_1$ under the gold ball where the width l of the bonding junction is constant. It is obvious from FIG. 6 that the maximum main stress $\sigma_1$ under the gold ball decreases with the decrease in the thickness d of the gold ball.

According to the present invention, the thickness of the gold ball may be reduced, the junction area may be increased and the ratio d/l may be selected to be smaller than 0.2 not at all bonding pads of the pellet 4 but at four corners only of the pellet 4. In this case, the present invention may not be effected to the four corners but may be effected to less than four corners such as three corners.

Figure 7:
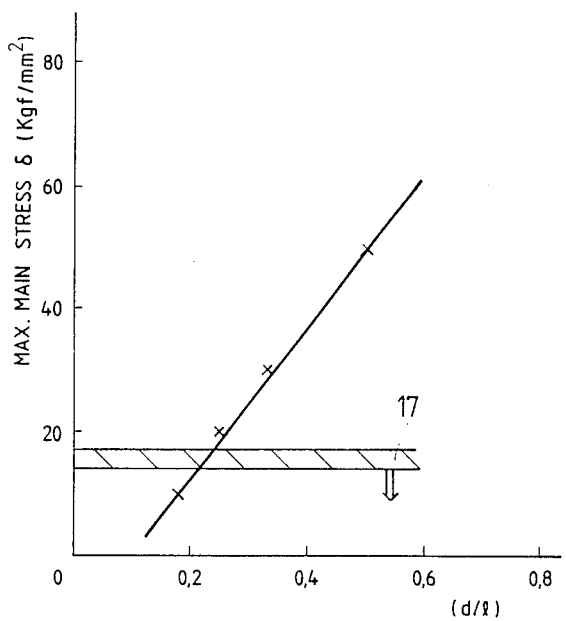
FIG. 7 is a graph showing a relationship between the stress and the ratio d/l of the width (l) of gold-aluminum alloy junction and the bonding thickness (d)
Figure 8:
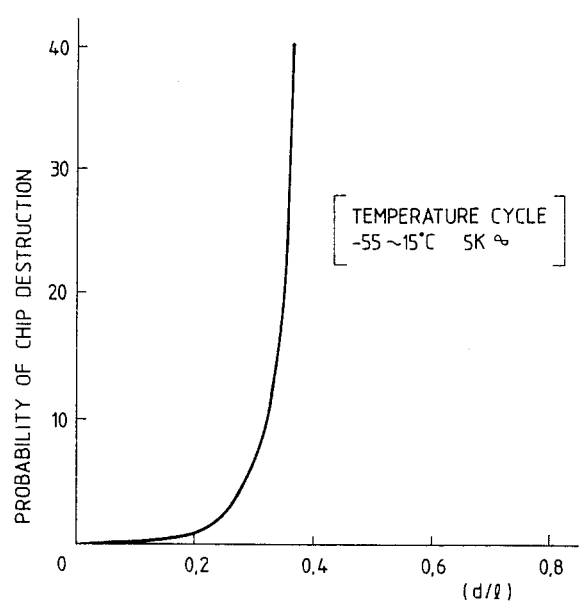
FIG. 8 is a graph showing experimental results of a relationship between the ratio d/l and the probability of chip destruction.

FIG. 7 is a graph showing a relationship between the maximum main stress $\sigma_1$ and the ratio d/l of the width l of gold-aluminum alloy junction and the thickness d of ball at the bonding portion, and FIG. 8 is a graph showing a relationship between the probability of chip destruction and the ratio d/l of the width l of gold-aluminum alloy junction and the thickness d of ball at the bonding portion.

In FIG. 7, reference numeral 17 denotes a line of crack limit. The crack limit is reached when the maximum main stress $\sigma_1$ lies from 14 to 17 (kgf/mm$^2$). No crack develops in the bonding pad when the maximum main stress $\sigma_1$ is smaller than the crack limit. The crack, however, develops in the bonding pad when the maximum main stress $\sigma_1$ is greater than the crack limit.

In FIG. 7, the maximum main stress $\sigma_1$ is smaller than the crack limit value when the ratio d/l is near 0.2.

FIG. 8 shows experiment results of probability of chip destruction under the conditions of 5000 times of temperature cycles ranging from $-55°$ to $5°$ C. while changing the ratio d/l.

It will be understood from FIG. 8 that the chip is not broken when the ratio d/l is near 0.2, but the probability of chip destruction increases abruptly as the ratio d/l becomes greater than 0.2.

That is, as will be understood from FIGS. 7 and 8, development of crack can be prevented most effectively when the ratio d/l of the gold-aluminum junction width l at the bonding portion to the ball thickness d is smaller than 0.2.

Figure 9:
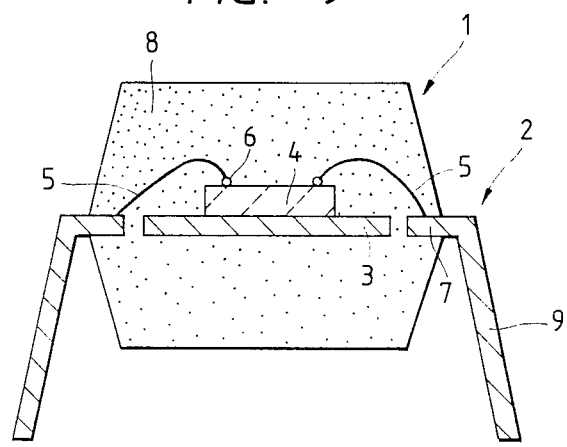
FIG. 9 is a section view of a resin molded simiconductor device.

FIG. 9 is a section view of a DIP (dual in line package)-type plastic package 1 according to the present invention.

Figure 10:
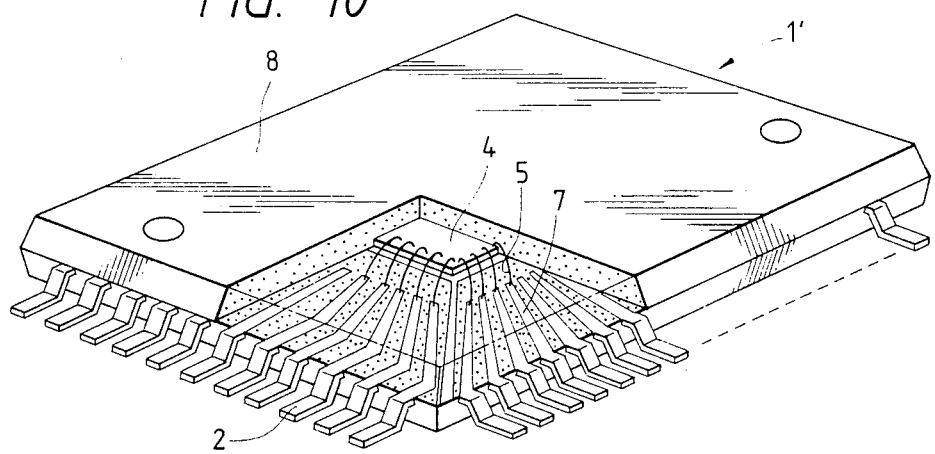
FIG. 10 is a perspective view showing partly in cross section the resin molded semiconductor device.

FIG. 10 is a perspective view showing partly in cross section an FPP (flat pack package) plastic package 1'.

A pellet 4 is die-bonded onto a tab 3 of a lead frame 2, an end of a connection wire 5 is bonded onto a bonding pad 6 of the pellet 4, and the other end of the connection wire 5 is bonded to a tip of an inner lead 7 of the lead frame 2. Namely, the pellet 4 and the lead frame 2 are electrically connected together through the connection wire 5 that is bonded thereto, and the electric input and output signals are taken out to the external side so that the pellet 4 is allowed to work. The pellet 4 and the junction portion of the connection wire 5 and the pellet 4 are protected from the external environment being molded with a resin 8. The lead portion drawn from the resin molded portion 8 of the lead frame 2 is called outer lead 9. The outer lead 9 can be plugged into the mounting substrate such as a printed wiring board (not shown).

Next, described below is the method of wire bonding.

Referring to FIG. 2, a gold wire is passed through a capillary 18 to form a ball at the tip of the wire by the generally employed hydrogen torch method. According to the present invention, the gold ball is formed in a small size to decrease its thickness compared with that of the conventional art. The gold ball is then pressed by the capillary 18 onto a bonding pad 61 composed of aluminum and is electrically connected thereto under the conditions of a temperature of about 200° C., a weight of 50 to 90 g and a time of 10 to 50 msec. A gold-aluminum alloy layer is formed between the gold ball and the aluminum pad due to the bonding force or ultrasonic waves, and whereby electric connection is obtained. The ball thickness d at the bonding portion is determined by the size of the gold ball and the pressing condition of the capillary 18. That is, the ball thickness d at the bonding portion becomes nearly equal to a distance from the surface of the bonding pad 6 to the end of the capillary 18. Then, the wire bonding is completed through the conventional step of inner lead bonding.

What is claimed is:

1. A semiconductor device comprising:
   a pellet on which on one surface are formed a circuit and bonding pads;
   a plurality of leads arranged around said pellet and having inner portions and outer portions;
   a plurality of wires of which the first tips are ball-bonded onto said bonding pads in a direction substantially perpendicular to said bonding pads and of which the second tips are bonded to the inner portions of said leads thereby to electrically connect said bonding pads and the leads together; and
   a molding resin for encapsulating said pellet, said inner portions of the leads and said wires;
   wherein said first tips are electrically connected while forming an alloy layer with said bonding pads, and the ratio d/l of the thickness d of said first tips to the width l of said alloy layer is selected to be smaller than 0.2.

2. A semiconductor device according to claim 1, wherein the thickness d of said first tips is substantially equal to a distance from said bonding pad to the tip of a capillary for said ball-bonding.

3. A semiconductor device according to claim 1, wherein said bonding pads are comprised of aluminum and said wires are comprised of gold.

4. A semiconductor device according to claim 1, wherein said alloy layer is a gold-aluminum eutectic layer.

5. A semiconductor device according to claim 1, wherein said molding resin is an epoxy resin.

6. A method of producing semiconductor devices comprising the steps of:
   preparing a pellet on one surface of which are formed a circuit and bonding pads;

arranging a plurality of leads consisting of inner portions and outer portions around said pellet;

ball-bonding the first tips of wires onto said bonding pads in a direction substantially perpendicular to said bonding pads to obtain electric conduction;

bonding the second tips of said wires onto said inner portions; and encapsulating said pellet, said inner portions of the leads, and the wires with a molding resin;

wherein said first tips are electrically connected to said bonded pads while forming an alloy layer, and the ratio d/l of the thickness d of said first tips to the width l of said alloy layer is selected to be smaller than 0.2.

7. A method of producing semiconductor devices according to claim 6, wherein the thickness d of said first tips is substantially equal to a distance from said bonding pad to the tip of a capillary for said ball-bonding.

8. A method of producing semiconductor devices according to claim 6, wherein said bonding pads are comprised of aluminum and said wires are comprised of gold.

9. A method of producing semiconductor devices according to claim 6, wherein said alloy layer is a gold-aluminum eutectic layer formed by bonding wires comprised of gold onto the aluminum bonding pads.

10. A method of producing semiconductor devices according to claim 6, wherein encapsulation is accomplished using an encapsulating material which comprises an epoxy-type resin.

11. A method of producing semiconductor devices according to claim 6, wherein said first tips of wires are initially formed into balls with a hydrogen torch and the balls are each pressed by a capillary onto each of the bonding pads to effect said ball-bonding.

* * * * *